(12) United States Patent
Frosien

(10) Patent No.: US 8,378,299 B2
(45) Date of Patent: Feb. 19, 2013

(54) TWIN BEAM CHARGED PARTICLE COLUMN AND METHOD OF OPERATING THEREOF

(75) Inventor: Jürgen Frosien, Riemerling (DE)

(73) Assignee: ICT Integrated Circuit Testing Gesellschaft fur Halbleiterpruftechnik MBH, Heimstetten (DE)

( * ) Notice: Subject to any disclaimer, the term of this patent is extended or adjusted under 35 U.S.C. 154(b) by 20 days.

(21) Appl. No.: 13/045,068

(22) Filed: Mar. 10, 2011

(65) Prior Publication Data

US 2011/0220795 A1    Sep. 15, 2011

(30) Foreign Application Priority Data

Mar. 10, 2010    (EP) .................................. 10156115

(51) Int. Cl.
*G01B 15/00*    (2006.01)
(52) U.S. Cl. .................... 250/311; 250/309; 356/450
(58) Field of Classification Search .................. 250/309, 250/310, 311
See application file for complete search history.

(56) References Cited

U.S. PATENT DOCUMENTS

| | | | |
|---|---|---|---|
| 3,638,231 A | | 1/1972 | LePoole et al. |
| 3,847,689 A * | | 11/1974 | Fletcher et al. .................. 216/75 |
| 3,986,027 A * | | 10/1976 | Holmes .......................... 250/310 |
| 4,935,625 A * | | 6/1990 | Hasegawa et al. ................. 850/9 |
| 5,192,867 A * | | 3/1993 | Osakabe et al. ............... 250/311 |
| 5,221,844 A * | | 6/1993 | van der Mast et al. ........ 250/398 |
| 5,500,527 A * | | 3/1996 | Zarubin ............................ 850/9 |
| 6,157,039 A * | | 12/2000 | Mankos ....................... 250/492.2 |
| 6,566,655 B1 * | | 5/2003 | Choo et al. ........................ 850/9 |
| 7,015,469 B2 * | | 3/2006 | Wang et al. .................... 250/311 |
| 7,601,957 B2 * | | 10/2009 | Endoh et al. ................... 250/311 |
| 7,655,905 B2 * | | 2/2010 | Harada et al. ................. 250/306 |
| 7,750,298 B2 * | | 7/2010 | Harada et al. ................. 250/311 |
| 7,791,023 B2 * | | 9/2010 | Kasai et al. ................... 250/311 |
| 7,816,648 B2 * | | 10/2010 | Harada et al. ................. 250/311 |
| 7,872,755 B2 * | | 1/2011 | Harada et al. ................. 356/450 |
| 7,880,143 B2 * | | 2/2011 | Tanimoto et al. ............. 250/310 |
| 7,923,685 B2 * | | 4/2011 | Harada et al. ................. 250/310 |
| 2006/0124850 A1 * | | 6/2006 | Matsumoto et al. .......... 250/310 |
| 2009/0078868 A1 * | | 3/2009 | de Jonge ....................... 250/310 |
| 2009/0206256 A1 * | | 8/2009 | Harada et al. ................. 250/310 |
| 2011/0220795 A1 * | | 9/2011 | Frosien ......................... 250/307 |

FOREIGN PATENT DOCUMENTS

EP    1463087 A1    9/2004

OTHER PUBLICATIONS

Extended European Search Report, EP Application No. 10156115.7, Jun. 4, 2010.

* cited by examiner

*Primary Examiner* — David A Vanore
(74) *Attorney, Agent, or Firm* — Patterson & Sheridan, LLP

(57) ABSTRACT

A column for a charged particle beam device is described. The column includes a charged particle emitter for emitting a primary charged particle beam as one source of the primary charged particle beam; a biprism adapted for acting on the primary charged particle beam so that two virtual sources are generated; and a charged particle beam optics adapted to focus the charged particle beam simultaneously on two positions of a specimen corresponding to images of the two virtual sources.

16 Claims, 10 Drawing Sheets

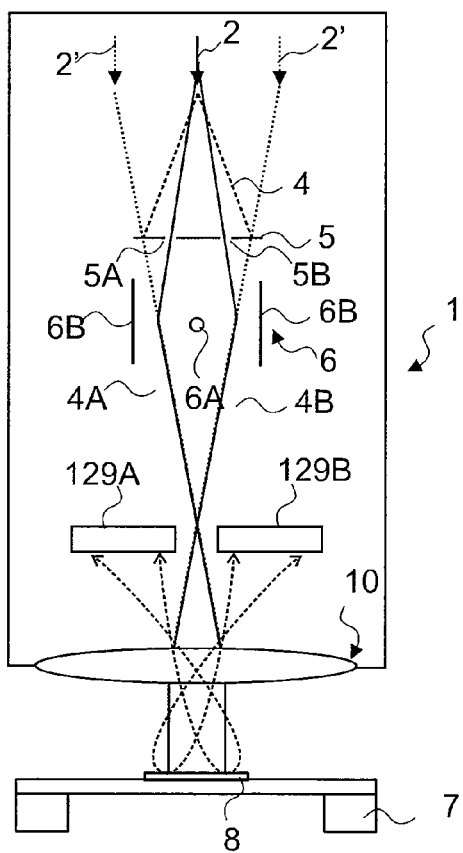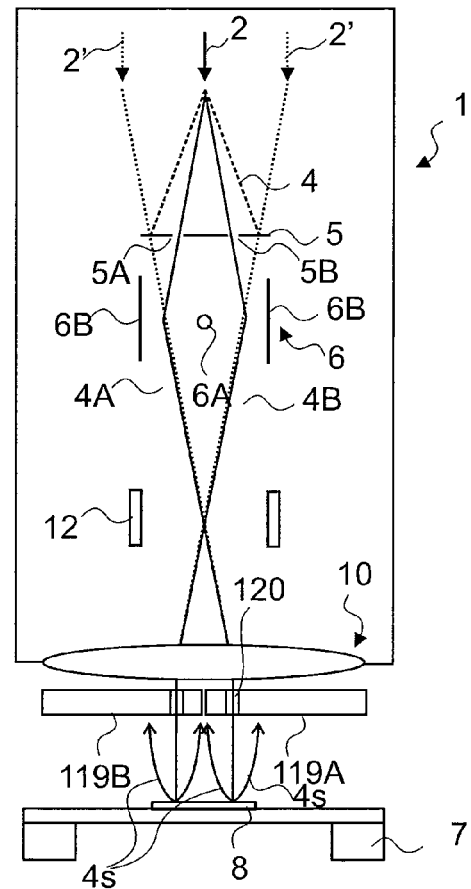
FIG 11
FIG 12

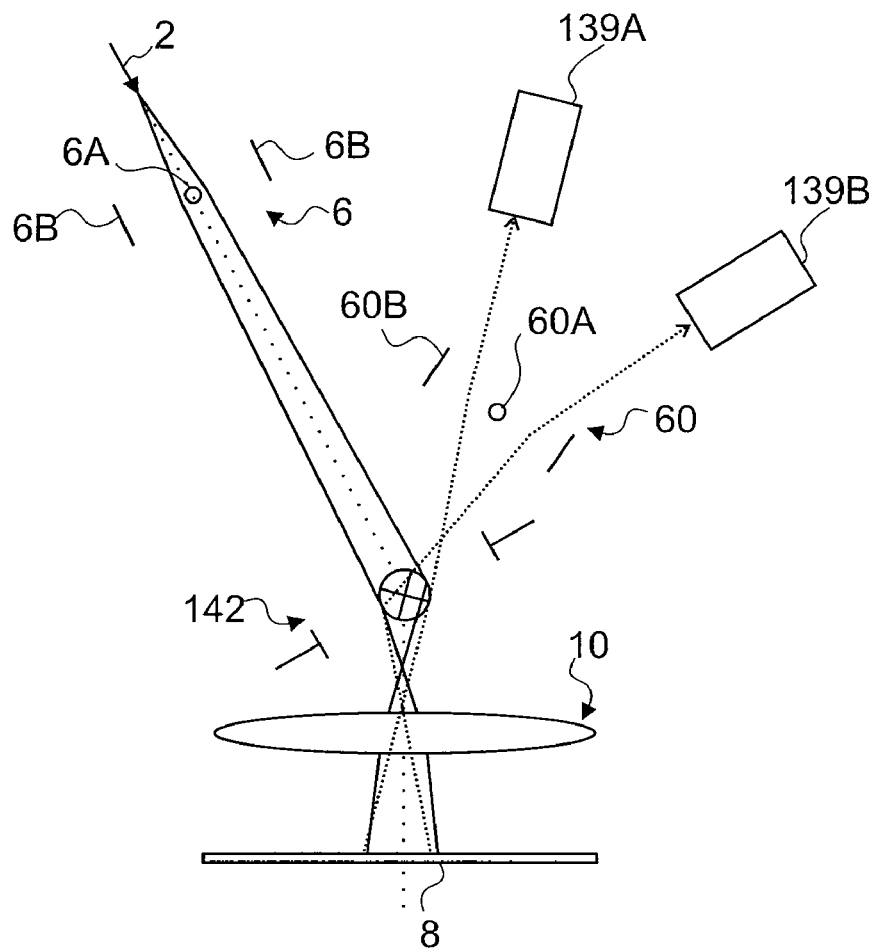
FIG 14
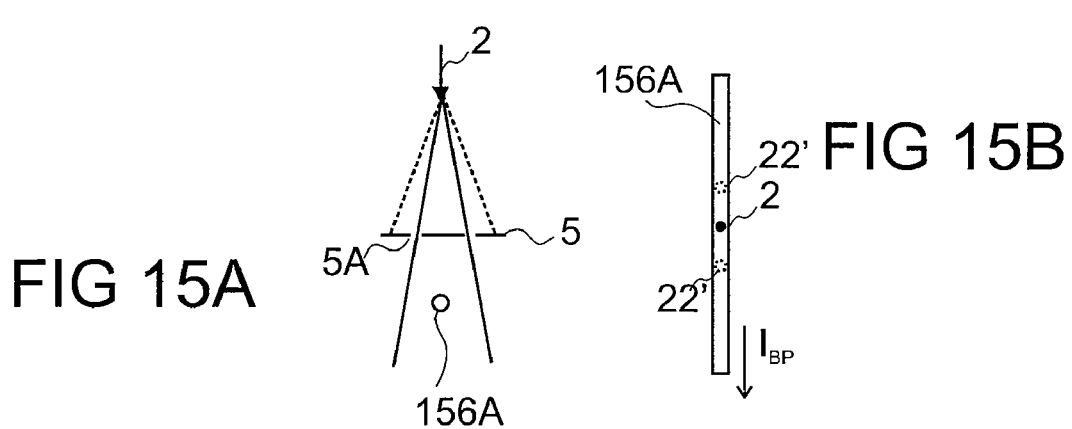
FIG 15A
FIG 15B

TWIN BEAM CHARGED PARTICLE COLUMN AND METHOD OF OPERATING THEREOF

FIELD OF THE INVENTION

Embodiments of the invention relate to a charged particle beam apparatus and methods of operating thereof. In particular, they relate to an apparatus with two beams of charged particles per charged particle beam column and a method of generating two charged particle beams per column.

BACKGROUND OF THE INVENTION

Technologies such as microelectronics, micromechanics and biotechnology have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators. Charged particle beams, in particular ion beams, offer superior spatial resolution compared to photon beams, due to their short wave lengths at comparable particle energy.

Modern semiconductor technology is highly dependent on an accurate control of the various processes used during the production of integrated circuits. Accordingly, the wafers have to be inspected repeatedly in order to localize problems as early as possible. Furthermore, a mask or reticle should also be inspected before its actual use during wafer processing in order to make sure that the mask accurately defines the desired pattern. This is done because any defects in the mask pattern will be transferred to the substrate (e.g., wafer) during its use in microlithography. However, the inspection of wafers or masks for defects requires the examination of the whole wafer or mask area. Especially, the inspection of wafers during their fabrication requires the examination of the whole wafer area in such a short time that production throughput is not limited by the inspection process.

Single beam scanning electron microscopes (SEM) or scanning ion microscopes have been used to inspect wafers to detect pattern defects. However, using a single beam at high resolution can result in a throughput limitation. In order to improve charged particle microscopic techniques several approaches have been suggested. One approach is based on the miniaturization and/or multiplication of the columns, so that several, typically miniaturized columns (in the order of ten to one hundred) are arranged in an array. Each column examines a small portion of the complete sample surface. Thereby, single beam columns can be used, which are simple and robust with respect to their optical characteristics. Another approach is the use of multi-beam optics, which are highly sophisticated. Thereby, the introduction of aberrations due to having multiple beams in one column, typically on different axes, is a serious issue to be considered.

Accordingly, there is a strong desire to provide a charged particle beam apparatus with an increased throughput, wherein the introduced aberrations are reduced.

SUMMARY OF THE INVENTION

Embodiments of the present invention provide an improved column for a charged particle beam device.

According to one embodiment, a column for a charged particle beam device is provided. The column includes a charged particle emitter for emitting a primary charged particle beam as one source of the primary charged particle beam, a biprism adapted for acting on the primary charged particle beam so that two virtual sources are generated, and a charged particle beam optics adapted to focus the charged particle beam simultaneously on two positions of a specimen corresponding to images of the two virtual sources.

According to another embodiment, A charged particle beam device, is provided. The charged particle beam device includes a charged particle beam column. The column includes a charged particle emitter for emitting a primary charged particle beam as one source of the primary charged particle beam, a biprism adapted for acting on the primary charged particle beam so that two virtual sources are generated, and a charged particle beam optics adapted to focus the charged particle beam simultaneously on two positions of a specimen corresponding to images of the two virtual sources.

According to yet another embodiment, a method of operating a charged particle beam column is provided. The method includes emitting a charged particle beam from on source, generating two sub-beams with a biprism, and focusing the two sub-beams on two positions of a specimen such that images of two virtual sources are generated.

BRIEF DESCRIPTION OF THE DRAWINGS

So that the manner in which the above recited features of the present invention can be understood in detail, a more particular description of the invention, briefly summarized above, may be had by reference to embodiments. The accompanying drawings relate to embodiments of the invention and are described in the following:

FIG. 11 shows schematically a column with yet other signal detection elements illustrating embodiments according to the present invention, FIG. 12 shows schematically a column with yet even other signal detection elements illustrating embodiments according to the present invention, FIG. 14 shows schematically a column with signal detection elements and yet further separated primary and secondary charged particle beams illustrating embodiments according to the present invention, and FIGS. 15A and 15B shows schematically another implementation for a biprism, which can be used in combination with the other embodiments described herein.

DESCRIPTION OF THE PREFERRED EMBODIMENTS

Reference will now be made in detail to the various embodiments of the invention, one or more examples of which are illustrated in the figures. Each example is provided by way of explanation of the invention and is not meant as a limitation of the invention. For example, features illustrated or described as part of one embodiment can be used on or in conjunction with other embodiments to yield yet a further embodiment. It is intended that the present invention includes such modifications and variations.

Without limiting the scope of protection of the present application, in the following description the charged particle beam device or components thereof will exemplarily be referred to as a charged particle beam device including the detection of secondary electrons. The present invention can still be applied for apparatuses and components detecting corpuscles such as secondary and/or backscattered charged particles in the form of electrons or ions, photons, X-rays or other signals in order to obtain a specimen image.

Generally, when referring to corpuscles it is to be understood as a light signal, in which the corpuscles are photons, as well as particles, in which the corpuscles are ions, atoms, electrons or other particles.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as memory disks and the like. Embodiments of the invention may be applied to any workpiece on which material is deposited which has to be examined or inspected or which has to be structured. A specimen includes a surface to be inspected, tested, structured or on which layers are deposited, an edge, and typically a bevel.

According to embodiments described herein, charged particle beam systems are provided for imaging, sample inspection, testing, lithography and sample modification. Particularly, embodiments refer to electron beam inspection systems with increased throughput as compared to single beam devices.

The throughput is increased while providing high resolution twin-beam optics. Thereby, this multi-beam optics introduces smaller aberrations as compared to other multi-beam optics and reduces complexity of common multi-beam optics. Accordingly, two beams per column can be provided, which have the same performance or nearly the same performance as compared to a single beam column.

Figure 1A:
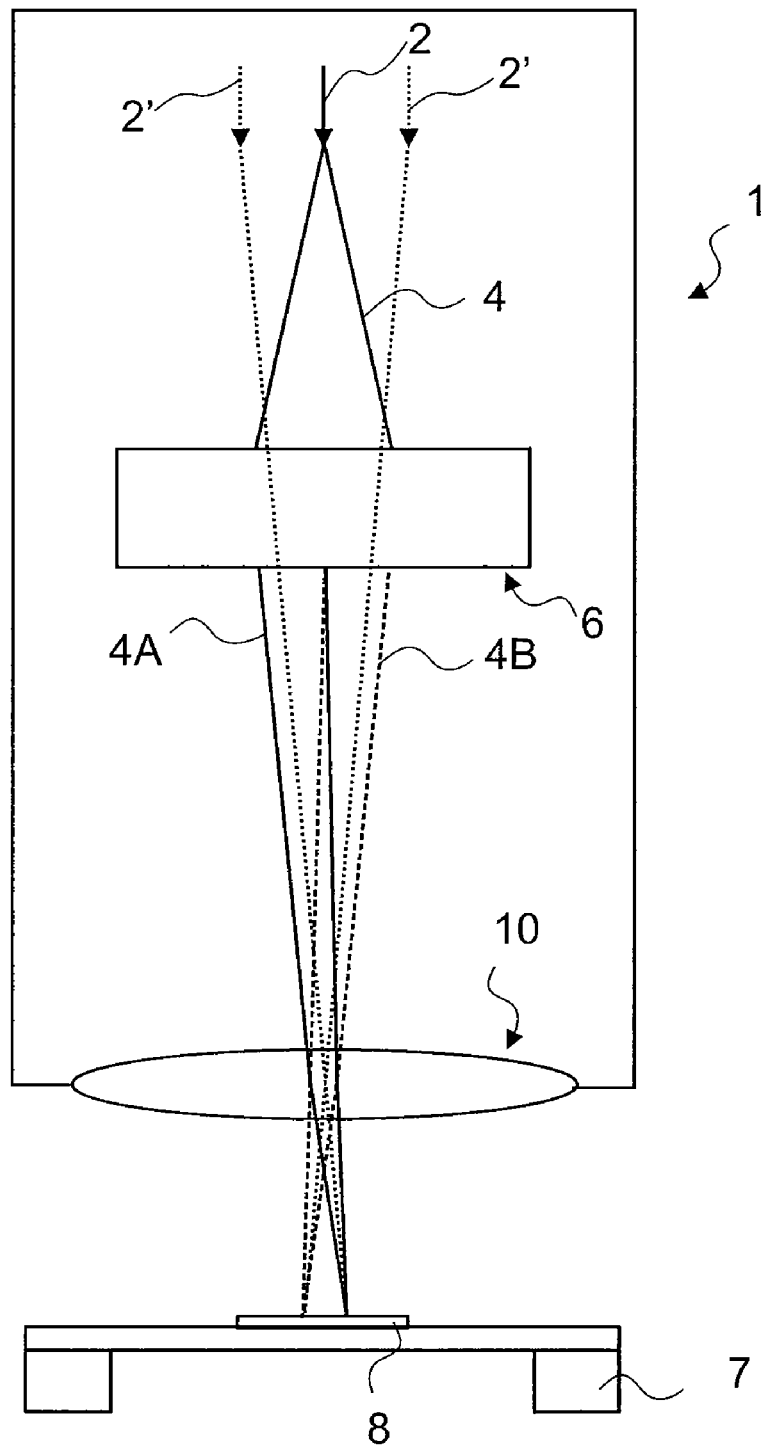
FIG. 1A shows schematically a column illustrating embodiments according to the present invention.

An embodiment according to the invention is shown schematically in FIG. 1A. The column 1 for a charged particle beam device includes a charged particle emitter 2 or charged particle source, which emits a beam 4 of charged particles. In electron beam devices, electron sources such as Tungsten-Hairpin guns, Lanthanum-Hexaboride Guns, Field emission guns etc. can be used. The invention, however, is not limited to electron sources; it can be used together with all kinds of charged particle sources. According to typical embodiments, which can be combined with other embodiments described herein, the emitter can be a thermal cathode, thermal field emission cathodes, cold field emission cathodes, photo-cathodes, nanotubes, like carbon nanotubes, gas field ions sources, liquid metal ion sources, or the like.

After leaving the charged particle source 2, the charged particle beam 4 passes through a biprism element 6. By passing through the biprism element 6, the charged particle beam is influenced such that two virtual sources 2' are generated. Accordingly, the charged particle beam has two sub-beams 4A and 4B, which appear to be emitted by different sources. Due to the combined effects of the biprism element 6 and a charged particle beam optics, for example the objective lens 10, two spots (images of the particle source 2), each corresponding to one of the charged particle beams 4A and 4B, are created on the specimen 8.

When the particles of beams 4A and 4B strike the surface of the specimen 8, they undergo a series of complex interactions with the nuclei and electrons of the atoms of the specimen. The interactions produce a variety of secondary products, such as electrons of different energy, X rays, heat, and light. Many of these secondary products are used to produce the images of the sample, inspect the sample, modify the sample and/or to collect additional data from it. A secondary product of major importance to examination or the image formation of specimens are secondary electrons that escape from the specimen 8 at a variety of angles with relatively low energy (0.5 to 50 eV). Accordingly, each of the two spots on the specimen leads to a corresponding signal on one or more detectors. By scanning the charged particle beams over the specimen and displaying/recording the output of a detector unit, multiple independent images of the surface of the specimen 8 can be formed. Each image contains information about a different portion of the surface of the specimen. Accordingly, the speed of the data acquisition is increased by a factor 2 with regard to the conventional single beam case. The specimen 8 is supported on a stage 7 (specimen support) which is moveable horizontally in all directions, in order to allow the charged particle beams to reach the target areas on the specimen which are to be examined.

Figure 1B:
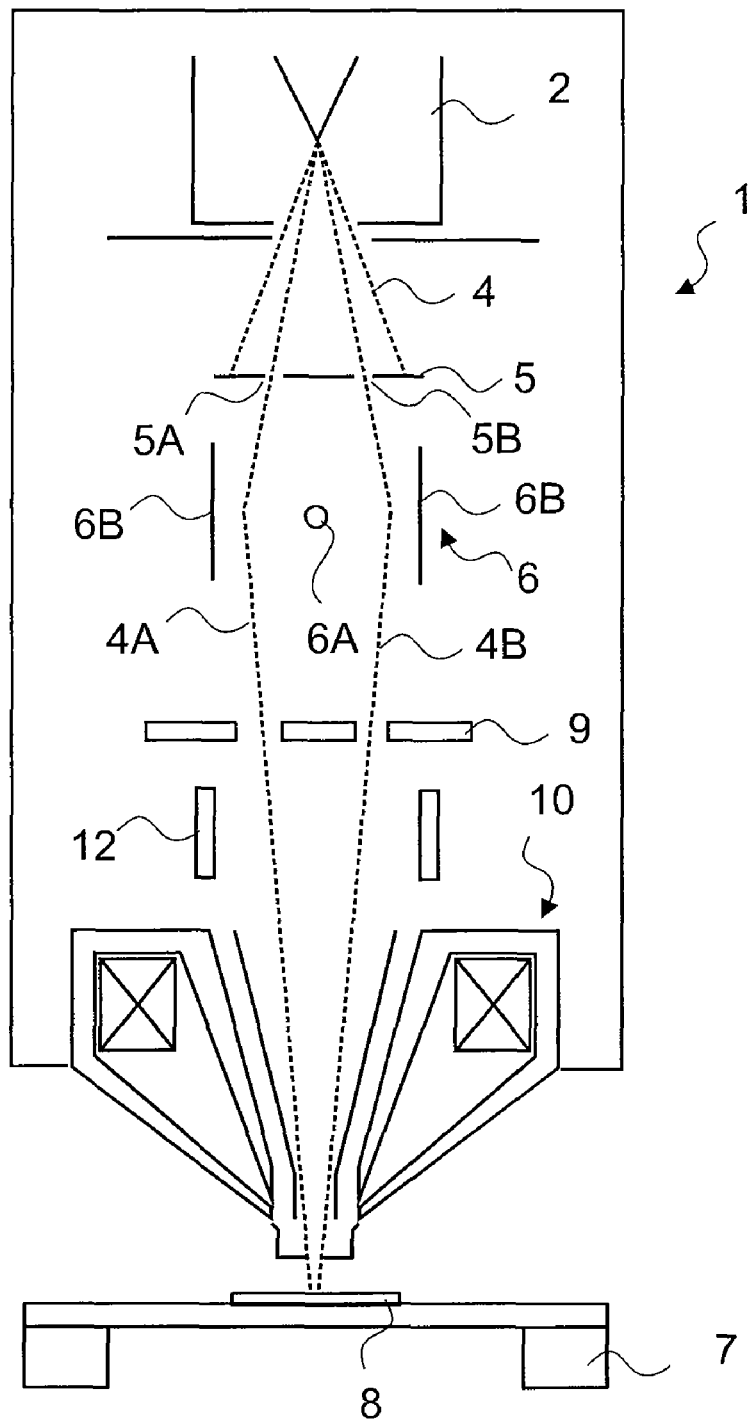
FIG. 1B shows schematically another column illustrating yet further embodiments according to the present invention.

Further optional details of embodiments according to the invention are shown schematically in FIG. 1B. The column 1 for a charged particle beam device includes a charged particle source 2 which emits a beam 4 of charged particles. In electron beam devices, electron sources such as Tungsten-Hairpin guns, Lanthanum-Hexaboride Guns, Field emission guns etc. can be used. The invention, however, is not limited to electron sources; it can be used together with all kinds of charged particle sources. According to typical embodiments, which can be combined with other embodiments described herein, the emitter can be a thermal cathode, thermal field emission cathodes, cold field emission cathodes, photo-cathodes, nanotubes, like carbon nanotubes, gas field ions sources, liquid metal ion sources, or the like. The charged particles are accelerated by an accelerating voltage supplied to the charged particle source 2.

After leaving the charged particle source 2, the charged particle beam 4 passes through an aperture plate 5 having multiple, typically two, apertures 5A and 5B, which are for example positioned concentrically with the axis of the aperture plate 5. By passing through the aperture plate 5, multiple charged particle beams, typically two charged particle beams 4A-4B are created. Further, according to embodiments described herein a biprism element 6 is provided. Typically, the biprism includes a wire 6A or a rod, such as a thin wire, which is placed between a pair of electrostatic plates 6B.

According to typical embodiments, which can be combined with other embodiments described herein, the wire 6A is provided centrically between the electrostatic plates 6B and the wire extends substantially cylindrically in one direction (perpendicular to the plane of FIG. 1B). Further, the wire can have a diameter of about 1 µm to 2 mm. According to yet further, embodiments, which can be combined with other embodiments described herein, the wire can also have a square or rectangular cross-section. In such a case, the above mentioned values of the diameter can be similarly applied to the maximum dimension of the cross-section.

For example, for the generation of two virtual sources (2' in FIG. 1A) for an electron beam a more positive potential (a positive charge) of the wire 6A, with respect to the pair of electrodes 6B, is to be applied. By passing through the biprism element 6, the charged particle beam is influenced such that two virtual sources are generated for the two sub-beams 4A and 4B. Accordingly, the charged particle beam has two sub-beams 4A and 4B, which appear to be emitted by different sources. Due to the combined effect of the biprism element 6 and a charged particle beam optics, for example the objective lens 10, two spots (images of the particle source 2), each corresponding to one of the charged particle beams 4A and 4B, are created on the specimen 8.

The charged particle beams 4A and 4B then pass the detector 9 which is used to detect those particles that come from the specimen 8 in order to produce multiple images of the specimen 8. The detector 9 can be divided into segments corresponding to the beams of charged particles. Thereby, each segment of the detector is capable of detecting particles that come from the specimen 8 independent of all the other segments of the detector 9. Furthermore, the detector 9 includes multiple openings to let the beams of charged particles pass through.

After the detector 9, the scanning coils 12 are provided which are used to move the charged particle sub-beams 4A-4B in a raster over the surface of the specimen 8. According to different optional implementations, the deflection coil for scanning can be positioned in a noticeable distance of e.g. 10% of the length of the column in direction of an optical axis in front of the lens. As a yet further alternative, then a double stage scan deflector can be beneficially used. In case that the deflector is closer to the lens or in the lens a single stage deflector can be used. According to yet further modification, the deflectors for scanning can be magnetic or electrostatic.

After the scanning coils 12, the charged particle beams enter the objective lens 10 which focuses the charged particle beams 4A and 4B onto the specimen 8. The objective lens 10 not only focuses the charged particle beams but also rotates the charged particle beams. However, this effect is not shown because it is difficult to depict in a two-dimensional drawing and because the skilled person is well aware of this additional effect. Due to the combined effects of the deflector 6 and the objective lens 10, multiple spots (images of the particle source 2), each corresponding to one of the charged particle sub-beams 4A and 4B, are created on the specimen 8.

When the particles of beams 4A and 4B strike the surface of the specimen 8, they undergo a series of complex interactions with the nuclei and electrons of the atoms of the specimen. The interactions produce a variety of secondary products, such as electrons of different energy, X rays, heat, and light. Many of these secondary products are used to produce the images of the sample and to collect additional data from it. A secondary product of major importance to examination or the image formation of specimens are secondary electrons that escape from the specimen 8 at a variety of angles with relatively low energy (0.5 to 50 eV). The secondary electrons are drawn through the objective lens 10, reach the detector 9, and are then measured. Thereby, the parameters of the objective lens 10 are chosen in such a manner that the secondary electrons and/or backscattered particles that come from specimen are accelerated towards and/or transferred onto the detector 9. Accordingly, each spot on the specimen leads to a corresponding signal on the detector. In the event of a segmented detector, the segments of the detector 9 can be selected so that each sub-beam basically corresponds to a segment.

By scanning the charged particle sub-beams 4A and 4B over the specimen and displaying/recording the output of the detector 9, multiple independent images of the surface of the specimen 8 are formed. Each image contains information about a different portion of the surface of the specimen. Accordingly, the speed of the data acquisition is increased by a factor 2 with regard to the conventional single beam case. The specimen 8 is supported on a stage 7 (specimen support) which is moveable horizontally in all directions, in order to allow the charged particle sub-beams to reach the target areas on the specimen which are to be examined.

According to some embodiments, in order to improve the performance of the system, the embodiments described with respect to FIGS. 1A and 1B can include an objective lens 10 which is a combination of a magnetic lens 10A and an electrostatic lens 10B. Accordingly, the objective lens 10 is a compound magnetic-electrostatic lens. Typically, the electrostatic part of the compound magnetic-electrostatic lens 10 is an electrostatic retarding lens 10B. Using such a compound magnetic-electrostatic lens 10 yields superior resolution at low acceleration energies, such as a few hundred electron volts in the case of a SEM. Such low acceleration energies are desirable, especially in modern semiconductor industry, to avoid charging and/or damaging of radiation sensitive specimens. However, the benefits of the present invention are also achieved if only a magnetic lens or only an electrostatic lens is used.

According to yet further embodiments, which an be combined with other embodiments described herein, the rod or wire 6A and the aperture plate 5 can be manufactured as one micro system technology element. Thereby, the aperture can be etched in a substrate and the wire can be deposited on the substrate and optionally etched into a desired shape. Further, microelectronic concepts can be applied to provide the wiring for applying a charge to the wire.

Figure 2:
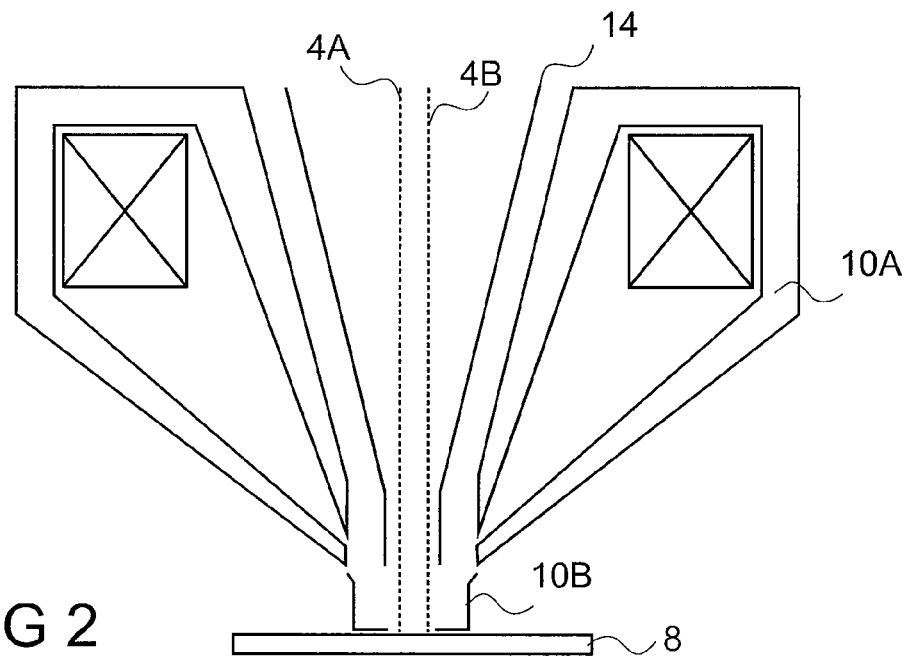
FIG. 2 is an enlarged view showing an objective lens which can be used for embodiments described herein, for example for the embodiments of FIGS. 1A and 1B.
Figure 3:
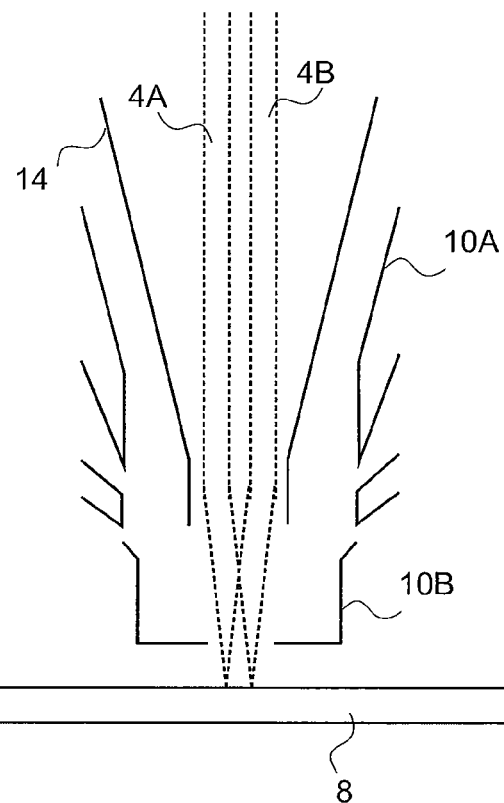
FIG. 3 is an enlarged view of FIG. 2.

FIGS. 2 and 3 show enlarged views on the compound magnetic-electrostatic lens 10 and the specimen 8 as shown in FIGS. 1A and 1B. To achieve a small focal length, the magnetic flux generated by a current through an excitation coil is conducted through pole pieces and is concentrated into a small region along the optical axis of the magnetic lens. The magnetic field is rotationally symmetric around the optical axis and reaches its maximum value in the pole gap between the upper and the lower pole piece. In addition to the magnetic lens 10A, the embodiment shown in FIGS. 1A to 3 contains an electrostatic retarding lens which is situated close to magnetic lens 10A. The electrostatic retarding lens 10B has two electrodes held at different potentials. In the illustrated embodiment, one of the two electrodes is formed by a cylindrical beam tube 14 which is arranged within the magnetic lens 10A along the optical axis. The second electrode of the electrostatic retarding lens 10B is a metallic cup provided below the magnetic lens 10A. In operation of the system, the first electrode is usually held at high positive potential, for example 8 kV, whereas the second electrode is held at lower positive potential, for example 3 kV, so that the electrons are decelerated in the corresponding electrostatic field from a first energy to a lower second energy. According to typical embodiments, the second energy can be 5 kV or below, can be 3 kV or below or can even be 1 kV or below.

In the example shown in FIGS. 2 and 3, the specimen 8 is held at ground potential. Accordingly, there is a further electrostatic retarding field between the metallic cup and the specimen 8. However, the surface of the specimen need not be grounded. The electric potential on the surface of the specimen may also be adjusted by applying a voltage to the specimen. A voltage can be applied to a wafer, for example, in order to obtain voltage contrast imaging which is used to detect shorts in a circuit. As long as the potential of the metallic cup is higher than the potential on the surface of the specimen, an electrostatic retarding field is produced. Furthermore, as long as the potential of the metallic cup is higher than the potential on the surface of the specimen, the secondary electrons (backscattered particles) are drawn into the objective lens 10 and reach the detector 9.

Figure 5:
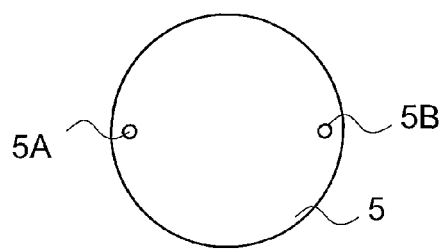
FIG. 5 shows schematically an aperture plate with apertures, i.e. aperture openings, which can be used according to embodiments described herein.

FIG. 5 shows schematically a top view on the aperture plate 5 as can be used in a column according to embodiments described herein. The aperture plate 5 includes two apertures 5A-5B. The aperture plate 5 is made of conducting material in order to avoid any charging effects. The size of the apertures 5A-5B is selected so that a predetermined current can be provided. According to further optional embodiments, additional apertures, i.e. aperture openings, can be provided. These aperture openings can have the same size as the apertures 5A and 5B in order to replace the apertures shown in FIG. 6 when they are contaminated. The replacement could e.g. be conducted by rotating the aperture plate. Additional apertures can additionally or alternatively be provided with a different size such that other beam currents can be generated when the additional openings are positioned to be within the desired charged particle beam path.

Figure 4A:
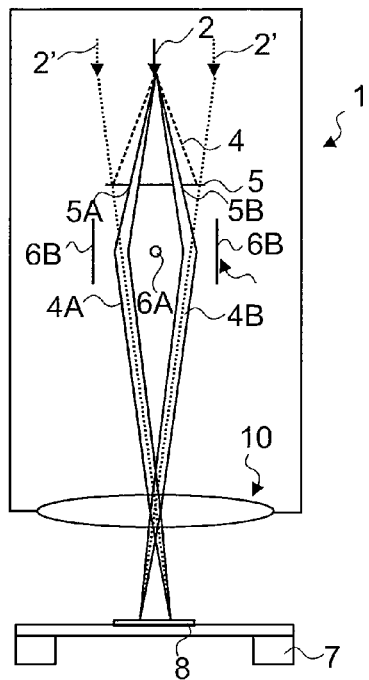
FIGS. 4A to 4C show schematically the use of a biprism according to embodiments described herein.
Figure 4B:
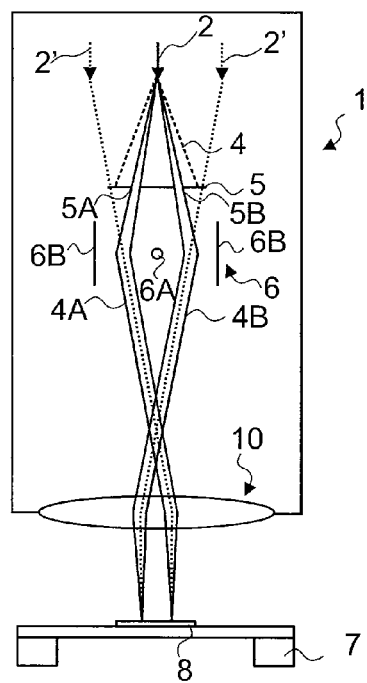
Figure 4C:
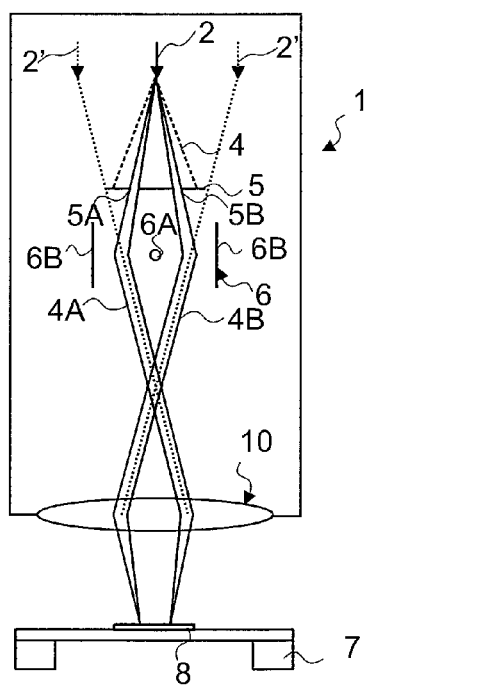

FIGS. 4A to 4C illustrate further embodiments, which can be combined with other embodiments described herein. An emitter 2 emits the charged particle beam 4. As shown in FIGS. 4A to 4C, an aperture plate with two or more apertures 5A, 5B can be provided such that separate sub-beams 4A and 4B are already provided by the aperture plate. The biprism 6 having a wire 6A and a pair of electrostatic plates 6B influences the primary electron beam 4 in combination with the charged particle beam optics (see, e.g., objective lens 10 in FIGS. 4A to 4C) such that the sub-beams 4A and 4B seem to originate from the virtual sources 2'. The beams are focused on specimen 8 by the charged particle beam optics, wherein the specimen is provided on a specimen location of the stage 7.

FIG. 4A shows schematically a beam path of the charged particle beam 4, which corresponds to a first excitation of the biprism 6. Thereby, for example, the electrodes 6B are on ground potential and the wire 6B is on a positive potential. FIG. 4B shows another situation with an excitation of the biprism, which is higher than the excitation shown in FIG. 4A. Thereby, the distance of the virtual sources 2' can be increased and the distance of the sub-beams 4A and 4B can be varied as well. Alternatively the angle of incidence on the specimen 8 can be controlled by the excitation of the bisprism. As one example, FIG. 4B shows an excitation with perpendicular incidence (inclination=0°) of the beams 4A and 4B on the specimen 8. If the excitation is further increased, as shown in FIG. 4C, the distance of the virtual sources 2' is further increased and the angle of inclination has an opposite sign as compared to inclination shown in FIG. 4A. Thereby, for example, the electrodes 6B are on ground potential and the wire 6B is on a positive potential.

According to different embodiments, a column with a twin-beam optics as described herein, can be operated by varying the excitation of the biprism 6. Thereby, according to yet further embodiments, which can be combined with other embodiments described herein, the distance between the two virtual sources can be varied. For example, the distance between the two virtual sources can be varied continuously from 0 μm to several micrometers, such as 10 μm or 50 μm or even up to a distance in the millimeter range, e.g. 1 mm or 2 mm. Thereby, the variation corresponds to the excitation and the geometrical dimensions of the arrangement. According to yet other embodiments, the inclination angles of the charged particle sub-beams on the specimen can be varied, wherein positive, parallel (0°), and negative angles are possible. Thereby, the variation of the angles and the distances of the virtual sources will change simultaneously.

Generally, according to embodiments, which can be combined with other embodiments described herein, a column for a charged particle beam device or a charged particle beam device can include further components, like alignment deflectors, further apertures, e.g. beam shaping or beam limiting apertures, correction elements like stigmators or elements for correcting spherical or chromatic aberrations, scan deflectors, and/or further lenses such as e.g. condenser lenses.

The twin optics as described herein in the form of a biprism introduces reduced aberrations as compared to other charged particle beam optics for providing two or more charged particle beams. Accordingly, a column with two columns and reduced complexity can be provided. However, in light of the doubling of one charged particle beam emitted by an emitter, the first sub-beam and second sub-beam will travel off-axis, i.e. not on an optical axis of the system, which is e.g. defined by the objective lens, or in a tilted manner. Accordingly, the sub-beams may penetrate the objective lens off-axis and/or tilted. This may in turn result in beam aberrations such as spherical aberrations or chromatic aberrations.

As described above, depending on the application and the desired resolution of the application, elements for aberration corrections can, thus, be provided in the column. However, according to the embodiments described herein, the aberrations introduced in these systems can be more easily corrected as compared to other multiple charged particle beam devices. Therefore, more simple correction elements can be provided in the column.

According to different embodiments, which may also be provided in combination which each other, electrostatic and/or magnetic octupoles can be used for correction of spherical aberrations; combined electrostatic magnetic quadrupole elements can be provided for correction of chromatic aberrations.

Figure 6:
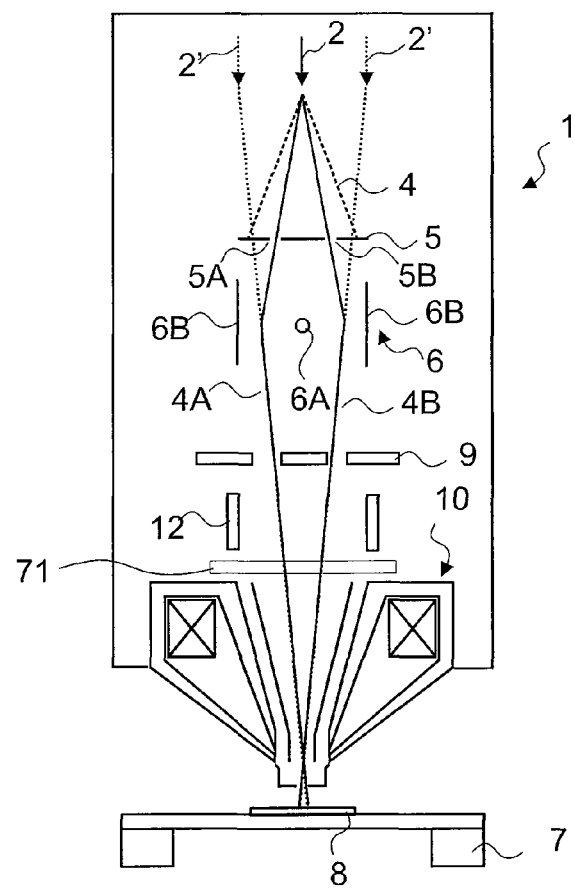
FIG. 6 shows schematically yet another column illustrating yet further embodiments according to the present invention.
Figure 7:
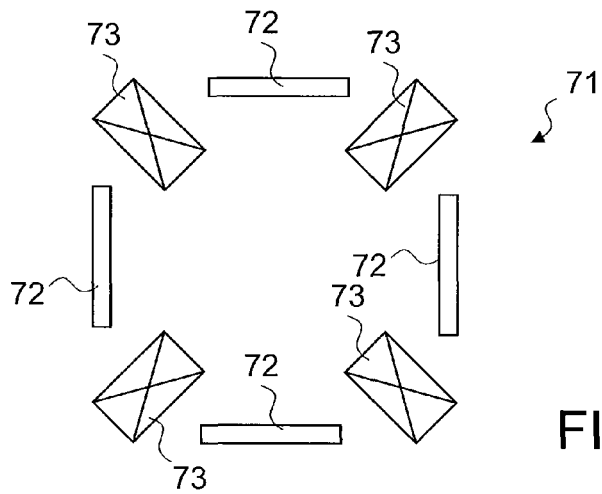
FIG. 7 shows schematically a column with aberration correction elements illustrating embodiments according to the present invention.

As an example, FIG. 6 shows a column 1, which is similar to the column shown in FIG. 1B, except for the combined electrostatic magnetic quadrupole element 71, which is positioned in FIG. 7 in beam direction before the objective lens 10. Thereby, two pair of electrostatic plates (elements 72 in FIG. 7) for generating an electrostatic quadrupole and four magnetic elements (elements 73 in FIG. 7) for generating magnetic quadrupole are provided for the correction. Thereby, the magnetic quadrupole is rotated by essentially 45° as depicted in FIG. 7

Figure 8B:
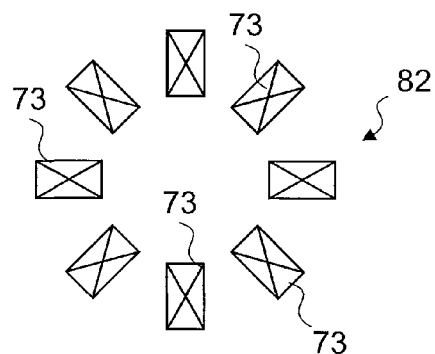
FIGS. 8A and 8B show schematically a column with yet further aberration correction elements illustrating embodiments according to the present invention.
Figure 8A:
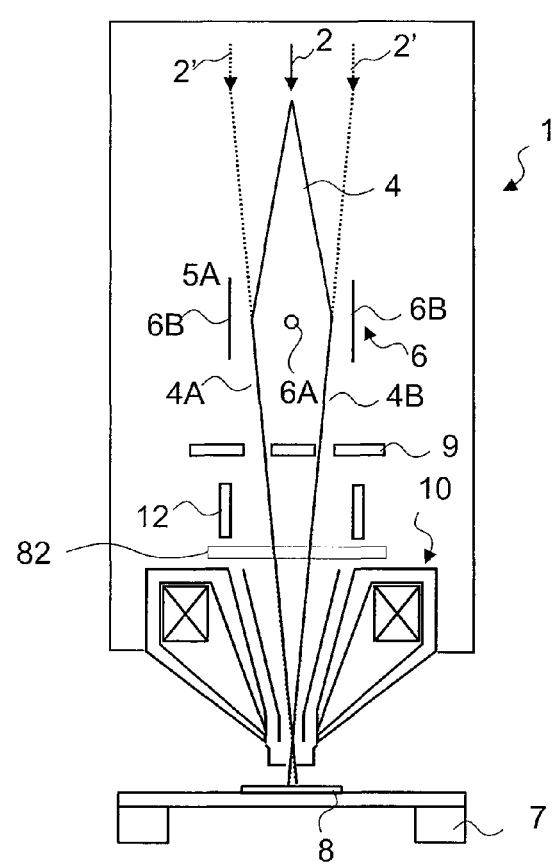
Figure 9:
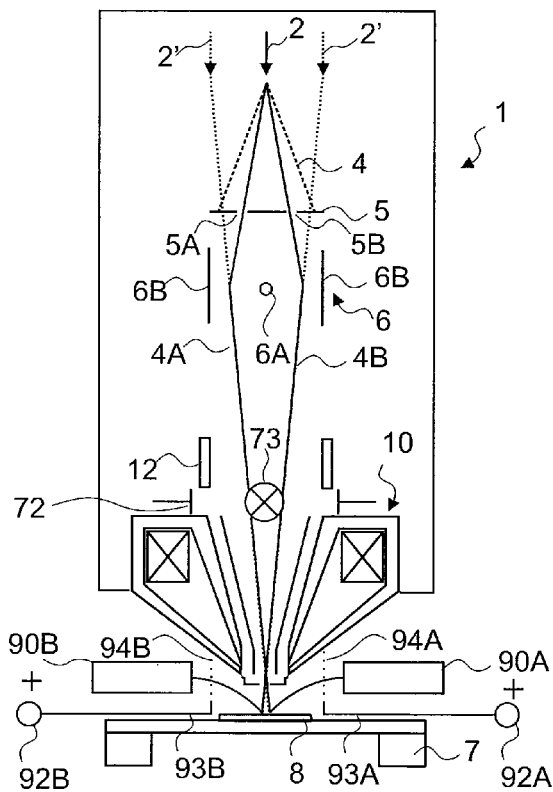
FIG. 9 shows schematically a column with signal detection elements illustrating embodiments according to the present invention.

As another example, FIG. 8A shows a column 1, which is also similar to the column shown in FIG. 1B, except for the magnetic octupole 82 for the correction of spherical aberration in a system including a biprism twin-beam optics. A magnetic octupole having 8 magnetic elements 73 is, for example shown in FIG. 8B.

Those elements are effective for beam correction mainly in one correction direction and when no or only small additional aberrations are introduced, e.g. by a beam separation device like a biprism. According to yet further alternative or additional modifications, the correction elements shown in FIGS. 7 and 8 can both be provided in a column or can be provided as a combined correction element, wherein the correction field is superimposed. The elements can be provided in the objective lens, close to the objective lens or at a position further upstream in the column, e.g. between the objective lens and the biprism.

According to yet further embodiments, which can be combined with other embodiments described herein, for signal detection, secondary and/or backscattered particles are detected with a detection unit. Thereby, typically, the detection unit includes at least two detectors and/or a detector with at least two segments. Accordingly, the signals generated by the two sub-beams of the primary charged particle beam can be detected independently.

According to one implementation, two Everhart Thornely type detectors 90A and 90B can be provided. Thereby, grids 94A and 94B can be biased on a positive potential (in the case of detection of secondary and/or backscattered electrons) such that the electrons are accelerated towards the detectors 90A and 90B. Typically, the grids 94A and 94B can be provided with the desired voltages over the connectors 92A/92B via conductors 93A/93B. According to typical implementations, the grids are biased to a potential of 10 to 500 V above the potential of the specimen 8. Further, according to yet further alternative modifications, the grids can be used as a spectrometer. Thereby, the grid is biased to a potential that provides a potential barrier for a portion of the signal charged particles which are not to be detected. The signal charged particles to be detected have sufficient energy to pass the potential barrier and can, thus be detected by the detectors 90A/90B, which are set to a higher potential to accelerate the charged particles, which pass through the grids, towards the detection surfaces of the detectors.

Figure 10:
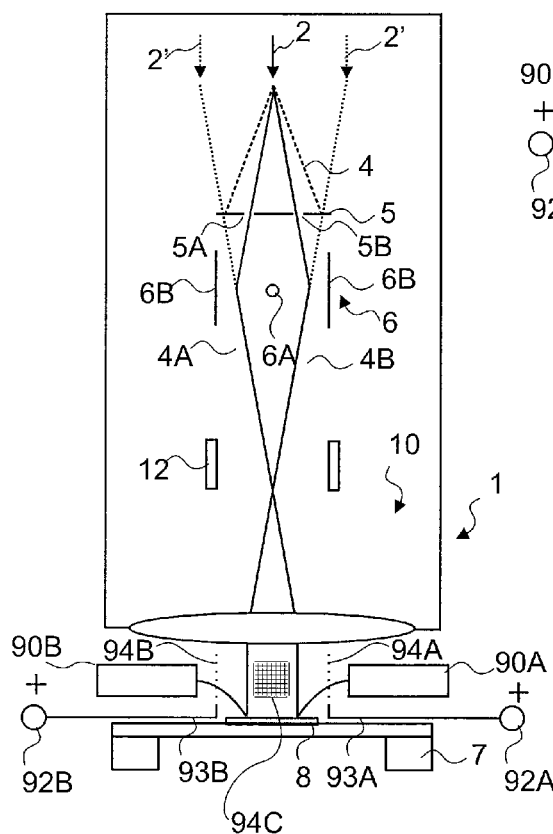
FIG. 10 shows schematically a column with other signal detection elements illustrating embodiments according to the present invention.

According to yet further embodiments, which can be combined with other embodiments described herein, a quadrupole detector can be provided in a column or used in a method, as shown in FIG. 10. Thereby, a multi-detector assembly with at least two detectors, e.g. four detectors can be used, wherein a quadrupole field such a magnetic quadrupole field is provided. In the Example shown in FIG. 10, the magnetic quadrupole would be rotated with respect to the optical axis by 45° and is, thus not shown. Examples of such a detection arrangement are described in co-pending European patent application Bo. 08166151. entitled "Charged particle detection apparatus and detection method" filed Oct. 8, 2008, which is incorporated herein by reference to the extent the applications are not inconsistent with this disclosure. Particularly, it is referred to the specification page 13, line 28 to page 17, line 16, wherein reference to FIG. 4 thereof is made. Thereby, for the embodiments shown in FIG. 10, typically only two detectors are active at the same time.

For example, such a detection apparatus can include four detectors and a separation field generating device which generates an electrical quadrupole field and a magnetic quadrupole field. The separation field generating device includes four electrodes, i.e. grids 94A, B and C in FIG. 10. Therein, the two electrodes e.g. grids can be biased with a positive voltage U1, and two electrodes e.g. grids can be biased with a negative voltage −U1. The separation field generating device may further include a magnetic quadrupole generating device which includes two magnetic south poles and two magnetic north poles. The poles may, e.g., be formed by coils and respective pole pieces. In such quadrupole configurations, the optical axis is substantially field-free. A primary beam travelling along the optical axis may not be influenced at all by the fields.

According to embodiments, negatively charged particles, e.g., negatively charged secondary particles such as secondary electrons are separated from positively charged particles, e.g., positively charged secondary particles such as secondary ions.

According to embodiments illustrated with respect to FIG. 10, two or more detectors can be used. If, for example, four detectors 90 A/B are used, the quadrupole arrangement allows for switching between two pairs of detector each. Thereby, two detectors can be active at the same time. The two pairs of detectors can, for example correspond to high current an low current modes of operations, such that two pairs of different types of detectors can be utilized.

According to yet further embodiments, which can be combined with other embodiments described herein, columns with biprism optics can be provided alternatively or additionally with the following detections units. Examples are shown in FIGS. 11 and 12. The column 1 for a charged particle beam device includes a charged particle source 2 which emits a beam 4 of charged particles. In electron beam devices, electron sources such as Tungsten-Hairpin guns, Lanthanum-Hexaboride Guns, Field emission guns etc. can be used. The invention, however, is not limited to electron sources; it can be used together with all kinds of charged particle sources. According to typical embodiments, which can be combined with other embodiments described herein, the emitter can be a thermal cathode, thermal field emission cathodes, cold field emission cathodes, photo-cathodes, nanotubes, like carbon nanotubes, gas field ions sources, liquid metal ion sources, or the like. The charged particles are accelerated by an accelerating voltage supplied to the charged particle source 2.

After leaving the charged particle source 2, the charged particle beam 4 passes through an aperture plate 5 having multiple, typically two, apertures 5A and 5B, which are for example positioned concentrically with the axis of the aperture plate 5. By passing through the aperture plate 5, multiple charged particle beams, typically two charged particle beams 4A-4B are created. Further, according to embodiments described herein, a biprism element 6 is provided. Typically, the biprism includes a wire 6A or a rod, such as a thin wire, which is placed between a pair of electrostatic plates 6B.

According to typically embodiments, which can be combined with other embodiments described herein, the wire is provided centrically between the electrostatic plates 6B and the wire extends substantially cylindrically in one direction (perpendicular to the plane of FIG. 1B). Further, the wire can have a diameter of about 1 μm to 2 mm. According to yet further, embodiments, which can be combined with other embodiments described herein, the wire can also have a square or rectangular cross-section. In such a case, the above mentioned values of the diameter can be similarly applied to the maximum dimension of the cross-section.

For example, for the generation of two virtual sources (2' in FIG. 1A) for an electron beam, a more positive potential (a positive charge) of the wire 6A with respect to the pair of electrodes 6B, is to be applied. By passing through the biprism element 6, the charged particle beam is influenced such that two virtual sources are generated for the two sub-beams 4A and 4B. Accordingly, the charged particle beam has two sub-beams 4A and 4B, which appear to be emitted by different sources. Due to the combined effects of the biprism element 6 and a charged particle beam optics, for example the objective lens 10, two spots (images of the particle source 2), each corresponding to one of the charged particle beams 4A and 4B, are created on the specimen 8.

Scanning coils 12 are provided which are used to move the charged particle sub-beams 4A-4B in a raster over the surface of the specimen 8. After the scanning coils 12, the charged particle beams enter the objective lens 10 which focuses the charged particle beams 4A and 4B onto the specimen 8. The objective lens 10 not only focuses the charged particle beams but also rotates the charged particle beams. However, this effect is not shown because it is difficult to depict in a two-dimensional drawing and because the skilled person is well aware of this additional effect. Due to the combined effects of the deflector 6 and the objective lens 10, multiple spots (images of the particle source 2), each corresponding to one of the charged particle sub-beams 4A and 4B, are created on the specimen 8.

When the particles of beams 4A and 4B strike the surface of the specimen 8, they undergo a series of complex interactions with the nuclei and electrons of the atoms of the specimen. The interactions produce a variety of secondary products, such as electrons of different energy, X rays, heat, and light. Many of these secondary products are used to produce the images of the sample and to collect additional data from it. A secondary product of major importance to examination or the image formation of specimens are secondary electrons that escape from the specimen 8 at a variety of angles with relatively low energy (0.5 to 50 eV).

By scanning the charged particle sub-beams 4A and 4B over the specimen and displaying/recording the output of the detector 9, multiple independent images of the surface of the specimen 8 are formed. Each image contains information about a different portion of the surface of the specimen. Accordingly, the speed of the data acquisition is increased by a factor 2 with regard to the conventional single beam case. The specimen 8 is supported on a stage 7 (specimen support) which is moveable horizontally in all directions, in order to allow the charged particle sub-beams to reach the target areas on the specimen which are to be examined.

As shown in FIG. 11, it is possible to provide a detection unit with two detectors 119A and 119B or with two segments below the objective lens 10. Thereby, openings 120 in the detectors or the segments, respectively, are provided such that each sub-beam of the primary charged particle beam can pass through the detection unit. The secondary and/or backscattered particles, which are indicated with reference numeral 4s in FIG. 11 are released from the specimen 8 and strike on the detectors 119A and 119B, respectively for generating an image or detecting a signal, wherein each signal corresponds to one of the two sub-beams.

For high resolution applications and systems or applications and systems with high current density, typically a column can be provided, which allows for objective lenses adapted for short focal lengths and low aberration. According to yet further embodiments, which can be combined with other embodiments described herein, and as shown in FIG. 12, a detection unit wherein secondary and/or backscattered particles pass through the objective lens can be provided. For such systems and applications immersion lenses are typically used, which decelerate the primary charged particle beam within the objective lens and/or between the objective lens and the sample. This has been described in more detail above with respect to FIGS. 2 and 3. The deceleration for the primary electrons result further in an acceleration for the secondary and/or backscattered electrons. Thus, all signal electrons are extracted from the specimen and can be detected in the objective lens or above the objective lens as shown in FIG. 12.

Within FIG. 12, the charged particle beams 4A and 4B then pass between the detectors 129A and 129B which are used to detect those particles that come from the specimen 8 in order to produce multiple images of the specimen 8. The detectors 129A and 129B can also be one detector, which is divided in segments corresponding to the beams of charged particles. Thereby, each segment of the detector is capable of detecting particles that come from the specimen 8 independent of all the other segments of the detector. Furthermore, between the detectors 129A and 129B or in the detectors there are openings to let the beams of charged particles pass through.

The secondary electrons are drawn through the objective lens 10, reach the detector 9, and are then measured. Thereby, the parameters of the objective lens 10 are chosen in such a manner that the secondary electrons and/or backscattered particles that come from the specimen are accelerated and/or directed onto the detector 9. Accordingly, each spot on the specimen leads to a corresponding signal on the detector. In the event of a segmented detector, the segments of the detector 9 can be selected so that each sub-beam basically corresponds to a segment.

According to yet further embodiments, which can be combined with other embodiments described herein, the primary charged particle beam having a first beam and a second beam, as well as the thereby typical use of two detectors or segmented detectors, can beneficially include a separation of the primary charged particle beam and the secondary (signal) charged particles. Thereby, the detectors for the signal charged particles can be configured independently of any constraints for the primary beam. Further, a separation of the secondary particles can allow of positioning of the detector unit such that space limitations are reduced.

According to different embodiments, a beam separation can be provided by electrostatic, magnetic, or combined electrostatic magnetic deflection arrangements. Some examples can be Wien filters, E×B filters, 2B or 4B deflectors or achromatic beam separation elements. Such beam separators can also be applied for the twin beam optics because the two bundles of secondary and/or backscattered particles, which are generated by the two sub-beams of the primary charged particle beam, are imaged into the detector space and can be detected on two separate detectors or two separate segments of a detector.

According to one exemplary embodiment, which can be combined with other embodiments described herein, a 2B deflection arrangement is used as a beam separator. This example is provided for a primary electron beam and detection of secondary and/or backscattered electrons. If for example a primary ion beam is used and secondary and/or backscattered electrons are detected a similar system can be provided with a two-stage electrostatic deflection assembly. The first pair of deflection coils 132, which is shown by one coil only for ease of drawing in FIG. 13, deflects the primary beam with sub-beams 4A and 4B from the emitter 2 in one direction. As an example this can be done after the biprism 6.

Figure 13:
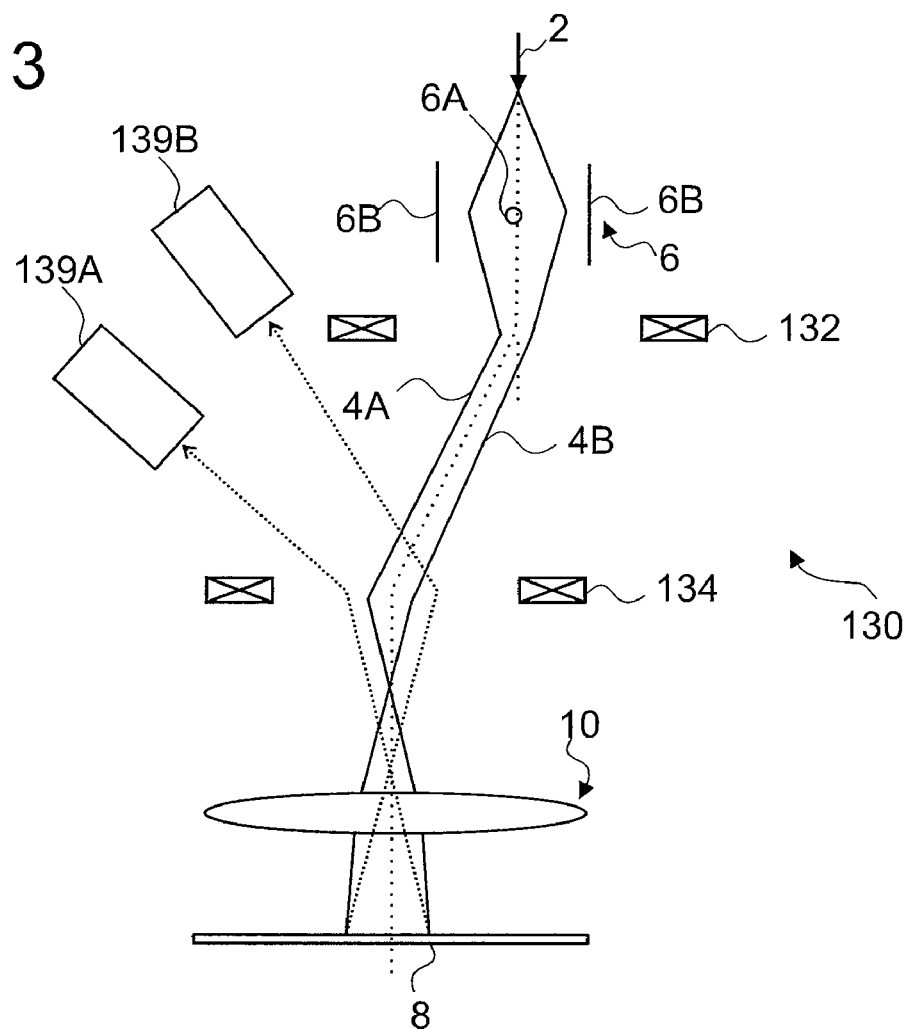
FIG. 13 shows schematically a column with signal detection elements and separated primary and secondary charged particle beams illustrating embodiments according to the present invention.

A second pair of deflection coils 134, which is shown by one coil only for ease of drawing in FIG. 13, deflects, i.e. redirects the beams 4A and 4B in order to travel substantially along the optical axis defined by objective lens 10. In light of the fact that the secondary and/or backscattered electrons travel in the opposite direction through the second magnetic deflection stage 134 on the way to detectors 139A and 139B, the deflection direction of the secondary and/or backscattered particles is such that the primary electrons and the signal electrons are separated. Thus, the detectors 139A and 139B can be positioned in a column area which is outside of the path of the primary beam. Accordingly, no openings in the detectors are required and positive potentials for attracting e.g. have no or a reduced influence on the primary electrons.

A yet further exemplary embodiment can be described with respect to FIG. 14. Therein, the beam separation is provided by an achromatic beam separator 142. An achromatic beam separator can be provided with an E×B deflector, which is described in more detail in EP patent application 09178967.7, entitled "Achromatic beam separator with reduced electron collision" filed Dec. 11, 2009 and EP patent application 09173111.7, entitled "Achromatic beam deflector, achromatic beam separator, charged particle device, method of operating an" filed Oct. 15, 2009 both of which are incorporated herein by reference to the extent that the applications are not inconsistent with this disclosure. Thereby, according to one embodiment, which can be provided with other embodiments described herein, an achromatic beam deflector device for deflecting a primary charged particle beam and providing the primary charged particle beam on an optical axis is included. The beam separator includes a primary charged particle beam inlet, a primary charged particle beam outlet encompassing the optical axis, a magnetic deflection element adapted to generate a magnetic field, and an electrostatic deflection element adapted to generate an electric field overlapping the magnetic field, wherein at least one element chosen from the electrostatic deflection element and the magnetic deflection element is positioned and/or positionable to compensate an octopole influence. Typically, the deflection angle is independent of the velocity of the electrons, under the condition that the magnetic force equals twice the electric force is fulfilled. In some embodiments described herein, the achromatic beam deflector or achromatic beam separator can be described at least by one of the following features. According to one embodiment, 20 to 100 ampere turns (Aturns), e.g. 50 Aturnes, may be provided, even for applications under increased column voltage or increased deflection angle. According to an even further embodiment, about 10 to 400 coil windings can be provided. Yet according to another embodiment, 50 to 500 coil windings can be provided. Nevertheless, it might be possible to provide even more coil windings, for example, up to a few thousand. Other important parameters are for instance the geometry of the coils, if present the iron core, the beam energy inside the deflector or separator, or the deflection angle.

Further, as shown in FIG. 14, a yet further biprism 60 is provided. The biprism 60 includes a pair of electrodes 60B and a wire 60A or a rod, such as a thin wire, which is placed between a pair of electrostatic plates 60B. According to typically embodiments, which can be combined with other embodiments described herein, the wire is provided centrically between the electrostatic plates 60B and the wire extends substantially cylindrically in one direction (perpendicular to the plane of FIG. 14). Further, the wire can have a diameter of about 1 µm to 2 mm. The biprism 60 increases the beam separation of the bundles of signal electrons, which correspond to the two spots on the specimen. Accordingly, space limitations for the detection unit including detectors 139A and 139B can be further reduced.

Further embodiments, resulting from the following teaching of FIGS. 15A and 15B to yield yet further embodiments, will be described in the following. FIG. 15a shows an emitter 2 emitting one primary charged particle beam. As an optional feature, an aperture plate 5 with apertures 5A and 5B may be used for generating two separate sub-beams. A biprism is provided by a wire 156A or a rod, such as a thin wire, which extends substantially cylindrically in one direction (perpendicular to the plane of FIG. 15A).

As shown with respect to FIG. 15A a biprism might not necessarily be provided with a pair of electrodes, wherein the wire is provided between the electrodes. The field of the biprism, particularly close to the wire, is determined by the wire itself. This is also applicable to the other embodiments described herein, and which refer e.g. to electrostatic biprisms. Accordingly, depending on the application and the primary beam geometry, the influence of the pair of plates can be neglected. According to yet further, embodiments, which can be combined with other embodiments described herein, even though the influence of the electrostatic plates of the biprism might be comparably small, further improvement of the biprism field can be realized by providing the plates in a shape selected from the group consisting of: flat plates, parallel flat plates, cylindrical plates e.g. concentric to the wire, and curved plates.

FIG. 15B shows the extension of the wire 156A and further indicates a current IBP in the wire. The current in the wire induces a magnetic field such that a magnetic biprism is formed. Thereby, similarly to the embodiments described with respect to FIG. 1A, the emitter position 2 is separated into two virtual emitter positions 22'. By passing through the magnetic biprism element, the charged particle beam is influenced such that two virtual sources 2' are generated. Accordingly, the charged particle beam has two sub-beams, which appear to be emitted by different sources. Due to the combined effects of the magnetic biprism element and a charged particle beam optics, for example an objective lens, two spots (images of the particle source 2), each corresponding to one of the charged particle beams, are created on a specimen. Thereby, the separation of the beams is in a plane essentially perpendicular to the paper plane in FIG. 15A. Accordingly, all aspects, which have been described with respect FIGS. 1A to 4C and 6 to 14, can be similarly applied to the biprism shown in FIGS. 15A and 15B, whereby, the plane of beam separation is different and the position and orientation of the elements have to be adapted accordingly.

In light of the above, a plurality of different embodiments have been described. For example, some of these embodiments include: a column for a charged particle beam device, said column including a charged particle emitter for emitting a primary charged particle beam as one source of the primary charged particle beam, a biprism adapted for acting on the primary charged particle beam so that two virtual sources are generated, and a charged particle beam optics adapted to focus the charged particle beam simultaneously on two positions of a specimen corresponding to images of the two virtual sources. Yet further embodiments can have one more of the following optional modifications, which can be combined with each other: the column may further include an aperture plate having at least two apertures to produce at least two sub-beams of the primary charged particle beam; the biprism can include one wire or rod, which is further optionally disposed between a pair of electrostatic plates and/or which extends substantially cylindrically in one direction; and the column can further include at least one detector for measuring secondary particles and/or backscattered particles coming from the specimen, and particularly wherein the detector is positioned between the emitter and an objective lens of the charged particle beam optics and includes at least one opening to let the beams of charged particles pass through. Thereby, according to yet further alternative or additional modifications the detector can be subdivided into two or more segments; the objective lens can be adapted to guide the secondary particles and/or backscattered particles onto the detector; and/or said objective lens can include a magnetic lens and an electrostatic lens.

According to yet further embodiments, which can be combined with the above embodiments, one or more of the following aspects can be realized: a first electrode and means for applying a first potential to said first electrode can be provided and wherein a second electrode and means for applying a second potential to said second electrode can be provided to generate an electrical field in said charged particle beam optics so that the particle beams in said electrical field are decelerated from a first energy to a second lower energy; by the combined action of the biprism and the charged particle optics the beams can be tilted and hit the specimen with predetermined angles of incidence; and the column can include at least one aberration correction unit adapted to correct spherical and/or chromatic aberrations, typically such that the at least one aberration correction unit is selected from the group consisting of: a combined electrostatic magnetic quadrupole element, a magnetic octupole or an electrostatic octupole.

According to yet other embodiments, a charged particle beam device can be provided. Thereby, the charged particle beam device can include a column with any of the aspects, details and embodiments, which have been described herein. Typically, the charged particle beam device can be an electron inspection tool.

According to yet other embodiments a method of operating a charged particle beam column is provided. The method includes emitting a charged particle beam from on source, generating two sub-beams with a biprism, and focusing the two sub-beams on two positions of a specimen such that images of two virtual sources are generated. According to typical modifications, one or more of the following aspects can be further utilized: the biprism can include a wire or rod extending in a first direction and the virtual sources are generated to be located in a plane perpendicular to the first direction.

While the foregoing is directed to embodiments of the invention, other and further embodiments of the invention may be devised without departing from the basic scope thereof, and the scope thereof is determined by the claims that follow.

The invention claimed is:

1. A column for a charged particle beam device, said column comprising:
   a charged particle emitter for emitting a primary charged particle beam as one source of the primary charged particle beam;
   a biprism adapted for acting on the primary charged particle beam so that two virtual sources are generated;
   a charged particle beam optics adapted to focus the charged particle beam simultaneously on two positions of a specimen corresponding to images of the two virtual sources;
   a beam separator for separating the primary charged particle beam and particles selected from the group consisting of secondary particles coming from the specimen, backscattered particles coming from the specimen, and secondary particles and backscattered particles coming from the specimen; and
   at least one detector for measuring the particles selected from the group consisting of secondary particles coming from the specimen, backscattered particles coming from the specimen, and secondary particles and backscattered particles coming from the specimen.

2. The column according to claim 1, further comprising:
   an aperture plate having at least two apertures to produce at least two sub-beams of the primary charged particle beam.

3. The column according to claim 1, wherein the biprism comprises a wire or rod.

4. The column according to claim 3, wherein the wire or rod:
   is disposed between a pair of electrostatic plates,
   extends substantially cylindrically in one direction, or
   is disposed between a pair of electrostatic plates and extends substantially cylindrically in one direction.

5. The column according to claim 1,
   wherein the detector is positioned between the emitter and an objective lens of the charged particle beam optics and comprises at least one opening to let the beams of charged particles pass through.

6. The column according to claim 5, wherein the objective lens is adapted to guide the particles selected from the group consisting of: secondary particles, backscattered particles; and secondary particles and backscattered particles; onto the detector.

7. The column according to claim 6, wherein the objective lens comprises a magnetic lens and an electrostatic lens.

8. The column according to claim 1, wherein the detector is subdivided into two or more segments.

9. The column according to claim 1, wherein a first electrode and means for applying a first potential to said first electrode are provided and wherein a second electrode and means for applying a second potential to said second electrode are provided to generate an electrical field in said charged particle beam optics so that the particle beams in said electrical field are decelerated from a first energy to a second lower energy.

10. The column according to claim 9, wherein the column is configured for the second lower energy being 5 kV or below.

11. The column according to claim 1, wherein, by the combined action of the biprism and the charged particle optics, the beams are tilted and hit the specimen with predetermined angles of incidence.

12. The column according to claim 1, wherein the column comprises at least one aberration correction unit adapted to correct one or more types of aberrations selected from the group consisting of: spherical and chromatic aberrations.

13. The column according to claim 1, further comprising:
   a biprism configured for increasing the beam separation of bundles of signal electrons.

14. A charged particle beam device, comprising:
   a charged particle beam column wherein the charged particle beam device is an electron inspection tool, and wherein said column comprises:
      a charged particle emitter for emitting a primary charged particle beam as one source of the primary charged particle beam;
      a biprism adapted for acting on the primary charged particle beam so that two virtual sources are generated;

a charged particle beam optics adapted to focus the charged particle beam simultaneously on two positions of a specimen corresponding to images of the two virtual sources;

a beam separator for separating the primary charged particle beam and particles selected from the group consisting of secondary particles coming from the specimen, backscattered particles coming from the specimen, and secondary particles and backscattered particles coming from the specimen; and at least one detector for measuring the particles selected from the group consisting of secondary particles coming from the specimen, backscattered particles coming from the specimen, and secondary particles and backscattered particles coming from the specimen.

15. A method of operating a charged particle beam column, the method comprising:

emitting a charged particle beam from one source;

generating two sub-beams with a biprism;

focusing the two sub-beams on two positions of a specimen such that images of two virtual sources are generated;

separating, by a beam separator, the primary charged particle beam and particles selected from the group consisting of secondary particles coming from the specimen, backscattered particles coming from the specimen, and secondary particles and backscattered particles coming from the specimen; and measuring the particles selected from the group consisting of secondary particles coming from the specimen, backscattered particles coming from the specimen, and secondary particles and backscattered particles coming from the specimen with at least one detector.

16. The method according to claim 15, wherein the biprism comprises a wire or rod extending in a first direction and the virtual sources are generated to be located in a plane perpendicular to the first direction.

* * * * *

UNITED STATES PATENT AND TRADEMARK OFFICE
CERTIFICATE OF CORRECTION

PATENT NO. : 8,378,299 B2
APPLICATION NO. : 13/045068
DATED : February 19, 2013
INVENTOR(S) : Frosien It is certified that error appears in the above-identified patent and that said Letters Patent is hereby corrected as shown below:

In the Specifications

Column 2, Line 14, please delete "A" and insert --a-- therefor;

Column 2, Line 27, please delete "on" and insert --one-- therefor;

Column 6, Line 51, please delete "an" and insert --can-- therefor;

Column 10, Line 27, please delete "an" and insert --and-- therefor;

Column 13, Line 46, please delete "Aturnes" and insert --Aturns-- therefor;

Column 15, Line 38, please delete "on" and insert --one-- therefor.

Signed and Sealed this
Fourteenth Day of May, 2013

Teresa Stanek Rea
*Acting Director of the United States Patent and Trademark Office*